United States Patent [19]
Fujikawa et al.

[11] Patent Number: 5,595,606
[45] Date of Patent: Jan. 21, 1997

[54] SHOWER HEAD AND FILM FORMING APPARATUS USING THE SAME

[75] Inventors: Yuichiro Fujikawa; Tatsuo Hatano; Seishi Murakami, all of Yamanashi-ken, Japan

[73] Assignee: Tokyo Electron Limited, Tokyo, Japan

[21] Appl. No.: 634,372

[22] Filed: Apr. 18, 1996

[30] Foreign Application Priority Data

Apr. 20, 1995 [JP] Japan .................................. 7-119403

[51] Int. Cl.⁶ .................................................. C23C 16/00
[52] U.S. Cl. ............................ 118/725; 118/715; 118/724
[58] Field of Search ................................ 118/715, 724, 118/725

[56] References Cited

U.S. PATENT DOCUMENTS

| | | | |
|---|---|---|---|
| 4,209,357 | 6/1980 | Gorin | 156/345 |
| 4,625,678 | 12/1986 | Shioya | 118/724 |
| 4,951,603 | 8/1990 | Yoshino | 118/725 |
| 5,252,131 | 10/1993 | Kiyama | 118/725 |

FOREIGN PATENT DOCUMENTS

| | | |
|---|---|---|
| 5-152208 | 6/1993 | Japan . |
| 6-275530 | 9/1994 | Japan . |

*Primary Examiner*—Richard Bueker
*Attorney, Agent, or Firm*—Oblon, Spivak, McClelland, Maier & Neustadt, P.C.

[57] ABSTRACT

A shower head of a metal CVD apparatus has a raw gas passage and a reduction gas passage for independently and respectively supplying a raw gas and a reduction gas into a process chamber. The shower head includes upper, middle and lower blocks which are formed independently of each other. Each of the raw gas passage and the reduction gas passage is branched from the upper block to the lower block. A coolant passage is formed in the lower block near supply outlets of the raw gas and the reduction gas for cooling the supply outlets. A heater is arranged in the upper and middle blocks for heating the raw gas passage.

20 Claims, 7 Drawing Sheets

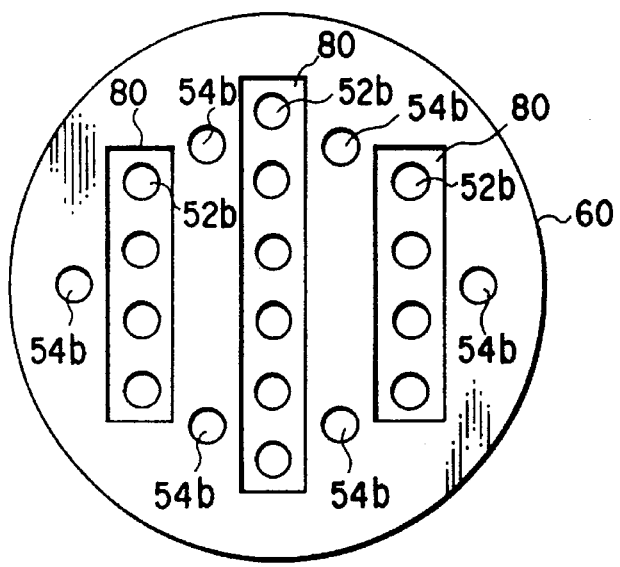
F I G. 4
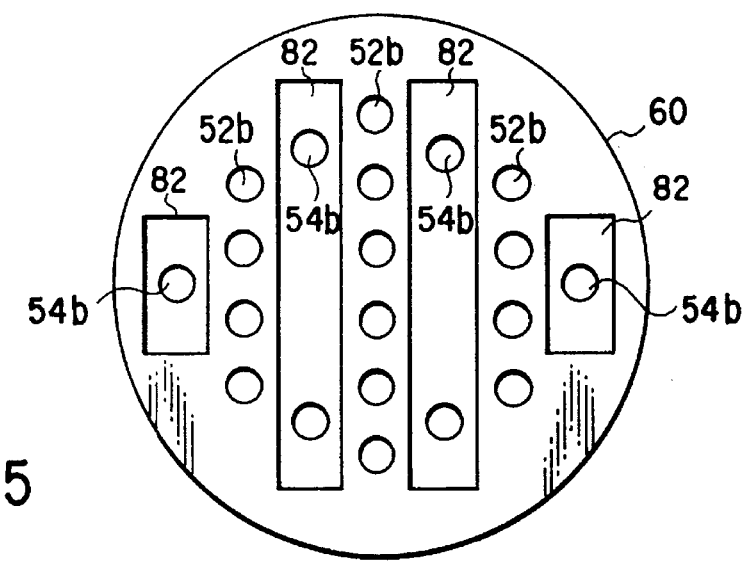
F I G. 5
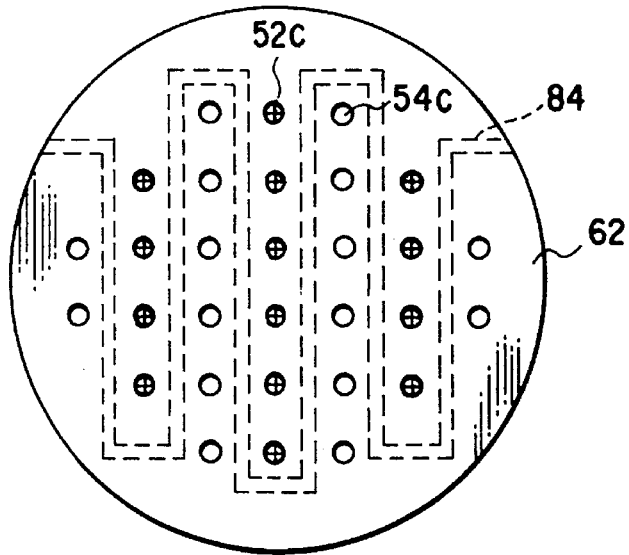
F I G. 6

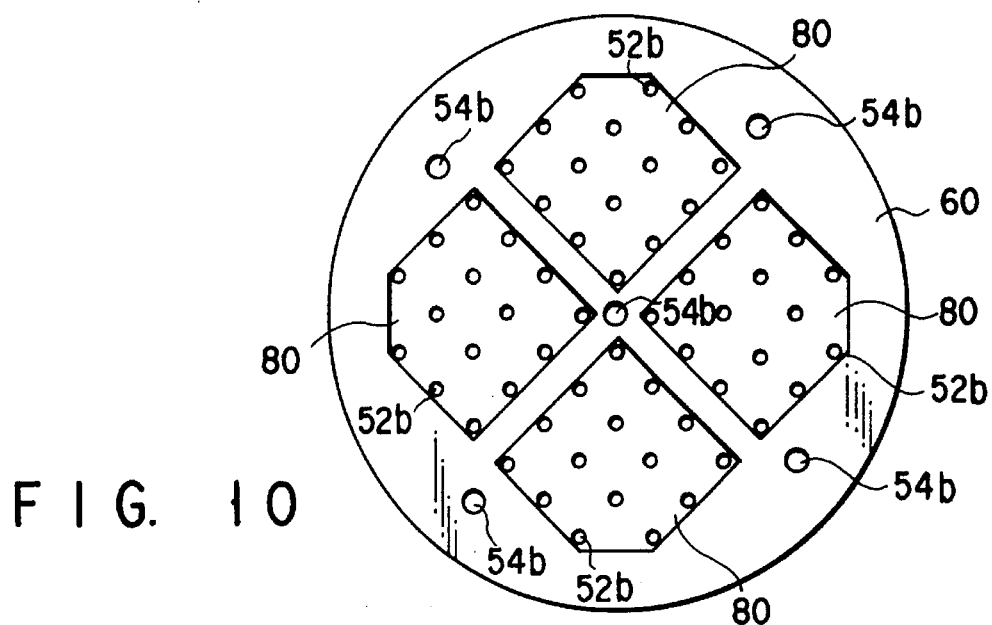
F I G. 10
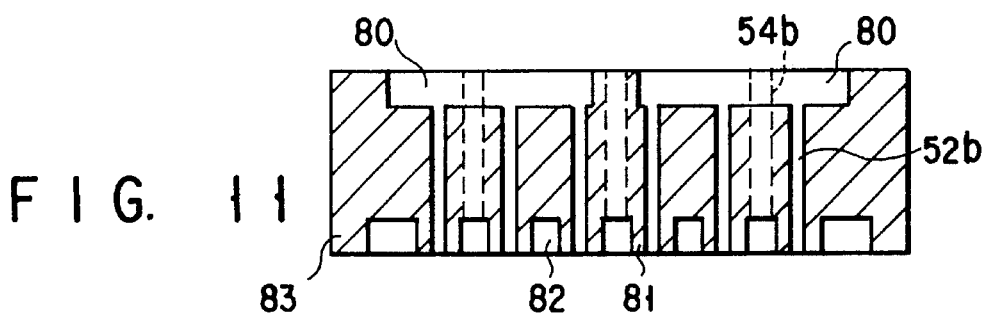
F I G. 11
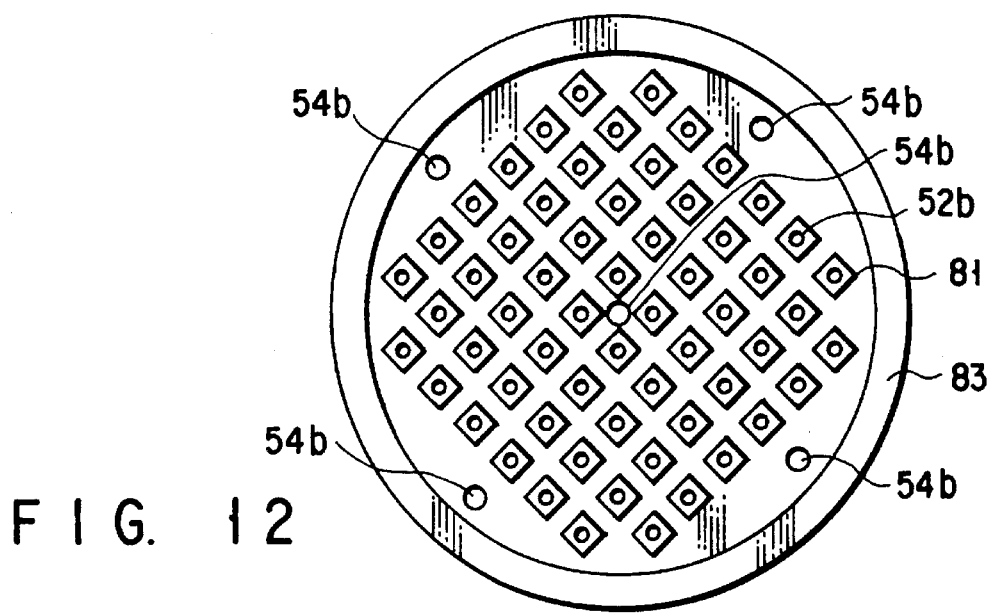
F I G. 12

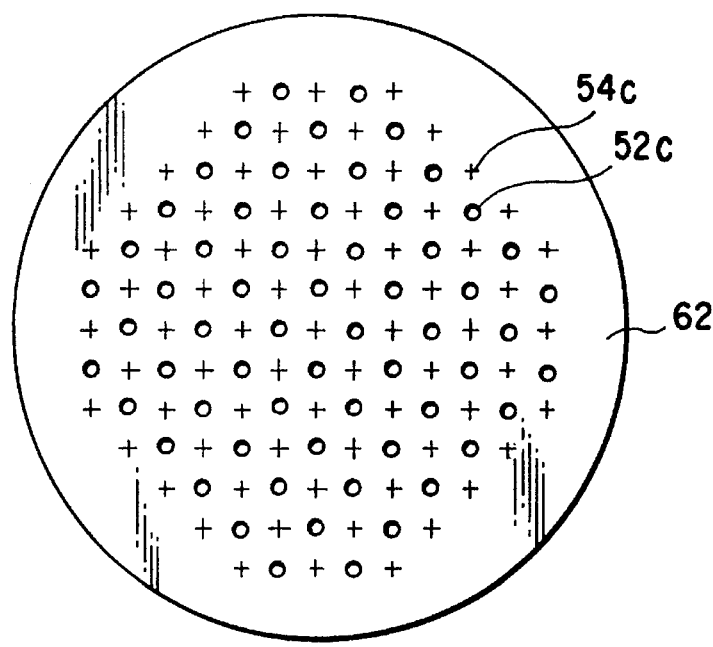
F I G. 13
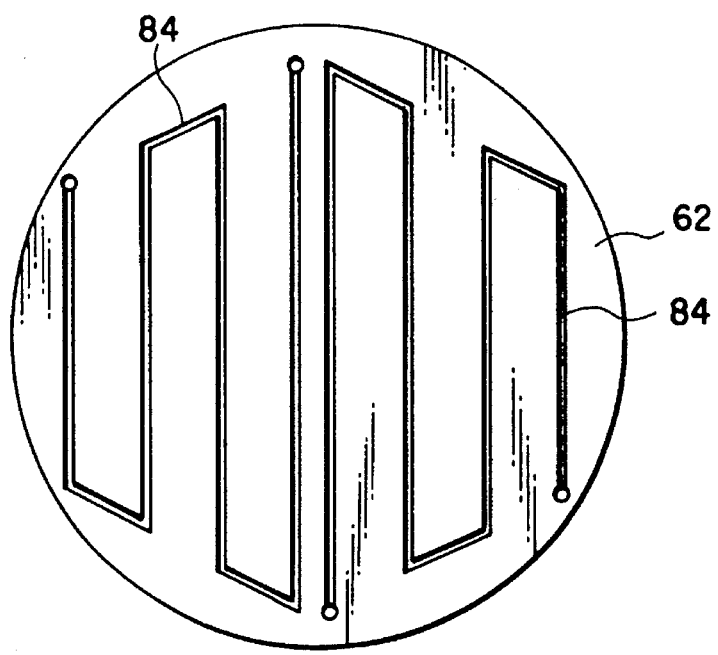
F I G. 14

SHOWER HEAD AND FILM FORMING APPARATUS USING THE SAME

BACKGROUND OF THE INVENTION

1. Field of the Invention

The present invention relates to a shower head for supplying at least two kinds of reaction gases, which can react with each other, into a process chamber, and a film forming apparatus using the shower head.

2. Description of the Related Art

A process for forming a film is utilized for arranging a semiconductor integrated circuit on a semiconductor wafer or an LCD substrate. As a film to be formed, there is an oxide film for insulation or a metal film for wiring. In a case where a titanium or titanium nitride film as the metal film is formed, an organic metal compound, such as dimethylaminotitanium or diethylaminotitanium is used as a raw gas. These organic metal compounds are in a liquid state or phase at a room temperature and have a low vapor pressure, and thus require a strict temperature administration. For example, if such compounds are used as a process gas, it is necessary to provide the supply system with a vaporizing mechanism and a heating mechanism.

FIG. 15 is a cross sectional view schematically showing a conventional film forming apparatus. This exemplifies a CVD apparatus for forming a titanium nitride film, i.e., TiN film formed as a metal film, in which semiconductor wafers are processed one by one. In a case where a TiN film is formed, used reaction gases are, e.g., tetradiethylaminotitanium, i.e., TDEAT, gas used as a raw gas, and ammonia, i.e., $NH_3$, gas used as a reduction gas.

As shown in FIG. 15, a work table 4 made of, e.g., graphite is arranged in a cylindrical process chamber 2 made of, e.g., aluminum. A semiconductor wafer W as an object to be processed is mounted and held on the work table 4. A transparent window 6 made of quartz glass is arranged at the bottom of the process chamber 2 to form a airtight seal. An intense heater, or heating lamps 8, such as halogen lamps, are rotatably arranged under the transparent window 6. The wafer W held on the work table 4 is heated by the heating lamps 8, up to a predetermined process temperature, such as 400° C.

A shower head 10 for spreading and supplying a process gas into the process chamber 2 is arranged at the top of the process chamber 2. The shower head 10 includes a cylindrical shower head body 12 made of, e.g., aluminum and a plurality of diffusion plates, for example, two diffusion plates 14 arranged in the head body 12. Gas pipes 16 and 18 are connected to the shower head body 12 for supplying reaction gases, more specifically for supplying tetradiethylaminotitanium, i.e., TDEAT, gas, and ammonia, i.e., $NH_3$, gas, respectively. The reaction gases are fed to the shower head body 12 through the gas pipes 16 and 18, respectively, along with a carrier gas consisting of an inactive gas, such as $N_2$ gas. The two reaction gases are mixed in the shower head body 12, distributed through distribution holes 20 formed in the diffusion plates 14, and then spread through spreading holes 22 into the process space. A film forming material is provided by reaction of the two reaction gases, so that a TiN film is formed on the wafer surface.

TDEAT is in a liquid state or phase at a room temperature, such as 40° C., or less, without reference to the pressure therearound. For this reason, the supply passage from a TDEAT source to the shower head 10 is heated not to liquefy the TDEAT gas in the passage.

On the other hand, where TDEAT is mixed with $NH_3$ and heated at a temperature of about 100° C. or more, it reacts with $NH_3$ and causes a product to be deposited on, e.g., a metal surface. For example, if the TDEAT gas is overheated in the supply passage and mixed with the $NH_3$ gas, the gases immediately start reacting. As a result, this gives rise to a problem in that a great amount of a product 24 is deposited in the shower head body 12.

SUMMARY OF THE INVENTION

Therefore, an object of the present invention is to improve a shower head for supplying at least two kinds of reaction gases, which can react with each other, into a process chamber.

According to a first aspect of the present invention, there is provided a shower head having first and second passages for independently and respectively supplying first and second reaction gases, which are capable of reacting with each other, into a process chamber, the first reaction gas being liquefied at and below a first temperature, and the first and second reaction gases reacting with each other at and above a second temperature which is higher than the first temperature, the shower head comprising:

first, second and third blocks independently formed and having holes which define the first and second passages, the second block being interposed between the first and third blocks, such that the first and second passages respectively have first and second introduction inlets arranged on the first block for respectively introducing the first and second gases, and also respectively have a plurality of first supply outlets and a plurality of second supply outlets arranged on the third block for respectively supplying the first and second reaction gases into the process chamber, and each of the first and second passages is branched from the first block to the third block;

a cooler arranged in the third block near the first and second supply outlets, for cooling the first and second supply outlets;

a heater arranged in the first and second blocks, for heating the first passage in the first and second blocks up to a temperature above the first temperature; and a connector for connecting the first, second and third blocks.

According to a second aspect of the present invention, there is provided a shower head having first and second passages for independently and respectively supplying first and second reaction gases, which are capable of reacting with each other, into a process chamber, the shower head comprising:

a first block having first and second faces arranged on the opposite sides, and first and second holes respectively constituting part of the first and second passages, such that the first and second holes of the first block respectively have first and second introduction inlets arranged on the first face of the first block for respectively introducing the first and second gases, and also respectively have outlets arranged on the second face of the first block;

a second block formed independently of the first block and arranged on the second face of the first block, the second block having first and second faces arranged on the opposite sides, a plurality of first holes constituting part of the first passage, and a plurality of second holes constituting part of the second passage, such that the first holes of the second block respectively have inlets commonly connected to a first recess arranged on the first face of the second block, and also respectively have outlets arranged on the second face of the second block, the first recess communicating with the first hole of the first block and constituting a manifold head for the first reaction gas, and the second holes of the second block respectively have inlets arranged on the first face of the second block, and also respectively have outlets commonly connected to a second recess arranged on the second face of the second block, the second recess constituting a manifold head for the second reaction gas;

a third block formed independently of the first and second blocks and arranged on the second face of the second block, the third block having first and second faces arranged on the opposite sides, a plurality of first holes constituting part of the first passage, and a plurality of second holes constituting part of the second passage, such that the first holes of the second block respectively have inlets arranged on the first face of the third block and communicating with the first holes of the second block, and also respectively have first supply outlets arranged on the second face of the third block for supplying the first reaction gas into the process chamber, and the second holes of the third block respectively have inlets arranged on the first face of the third block and communicating with the second recess, and also respectively have second supply outlets arranged on the second face of the third block for supplying the second reaction gas into the process chamber; and a connector for connecting the first, second and third blocks such that the second face of the first block and the first face of the second block face each other, and the second face of the second block and the first face of the third block face each other.

According to a third aspect of the present invention, there is provided a film forming apparatus for forming a film on an object to be processed, using first and second reaction gases, which are capable of reacting with each other, the first reaction gas being liquefied at and below a first temperature, and the first and second reaction gases reacting with each other at and above a second temperature which is higher than the first temperature, the apparatus comprising:

(a) a process chamber;

(b) a work table for supporting the object in the process chamber;

(c) a heater for heating the objected supported by the work table up to a third temperature higher than the second temperature;

(d) an exhaust for exhausting the process chamber; and (e) a shower head according to the first aspect of the present invention, having first and second passages for independently and respectively supplying the first and second reaction gases into the process chamber.

According to a fourth aspect of the present invention, there is provided a film forming apparatus for forming a film on an object to be processed, using first and second reaction gases, which are capable of reacting with each other, the apparatus comprising:

(a) a process chamber;

(b) a work table for supporting the object in the process chamber;

(c) an exhaust for exhausting the process chamber; and (d) a shower head according to the second aspect of the present invention, having first and second passages for independently and respectively supplying the first and second reaction gases into the process chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 4 and 5 are views showing the top and bottom faces, respectively, of a middle block included in the shower head assembly shown in FIG. 2;

FIG. 6 is a view showing the bottom face of a lower block included in the shower head assembly shown in FIG. 2;

FIGS. 10, 11 and 12 are views showing the top face, a cross sectional diagram of passage portions, and the bottom face, respectively, of a middle block included in the modification of the shower head assembly;

FIGS. 13 and 14 are views showing the bottom face, and a plane diagram of a coolant passage, respectively, of a lower block included in the modification of the shower head assembly.

DETAILED DESCRIPTION OF THE PREFERRED EMBODIMENTS

Figure 1:
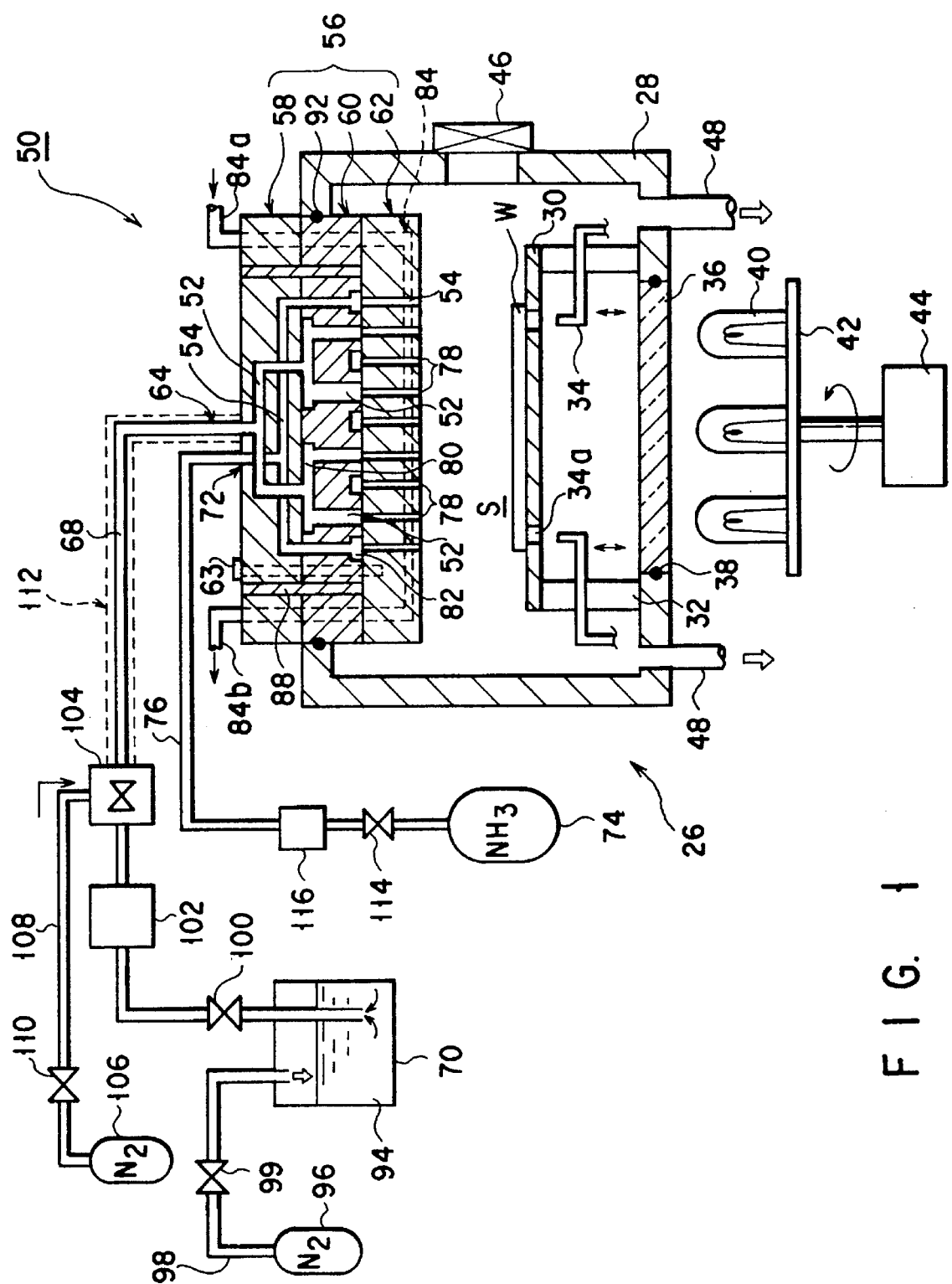
FIG. 1 is a cross sectional view schematically showing a film forming apparatus having a shower head according to an embodiment of the present invention.

As shown in FIG. 1, a metal CVD apparatus 26 for processing objects one by one is constituted to form a metal film, such as a TiN film, on a semiconductor wafer W as an object to be processed. The CVD apparatus 26 includes a process chamber 28 having a substantially cylindrical shape and made of a material, such as aluminum. A work table 30 made of, e.g., graphite is arranged in the process chamber 28, such that the work table 30 is supported by struts 32. The semiconductor wafer W as an object to be processed is mounted and held on the work table 30. The work table 30 may be made of such a material other than graphite, as amorphous carbon, composite carbon or AlN.

Lift pins 34 made of quartz glass are arranged under the work table 30 and are moved by driving means (not shown) in a vertical direction. The lift pins 34 can be projected and retreated through holes 34a formed in the work table 30, so that they support the wafer W and help a transfer operation when the wafer W is loaded or unloaded.

A transparent window 36 made of, e.g., quartz glass is arranged at the bottom of the process chamber 28 via a seal member 38 to form a airtight seal. An intense heater, or a plurality of heating lamps 40, such as halogen lamps, are arranged on a rotatable table 42 under the transparent window 36. The work table 30 in the process chamber 28 is heated by the heating lamps 40, so that the wafer W is heated and kept at a predetermined process temperature, such as 400° C. The rotatable table 42 is driven and rotated by a rotating mechanism 44, such as a motor, so that the wafer W is uniformly heated in a horizontal plane.

A gate valve 46 is arranged on a side wall of the process chamber 28 and is opened and closed when the wafer W is loaded or unloaded into or out of the process chamber 28. An exhaust port 48 is formed at the bottom periphery of the process chamber 28 and is connected to a vacuum pump (not shown). The vacuum pump allows the process chamber 28 to have a predetermined atmosphere of a reduced pressure, such as about 300 mTorr.

A shower head 50 for supplying a process gas into the process chamber 28 is arranged at the top of the process chamber 28. In this embodiment, since a TiN film is formed, the process gas includes, e.g., tetradiethylaminotitanium, i.e., TDEAT, gas used as a raw gas, ammonia, i.e., $NH_3$, gas as a reduction gas, and an inactive gas, such as $N_2$, Ar or He, as a carrier gas. Among theses gases, the raw gas and the reduction gas, which can react with each other, are supplied in to a process space S without being mixed in the shower head 50. In other wards, a raw gas passage 52 and a reduction gas passage 54 are formed in the shower head 50, independent of each other.

The shower head 50 has a head assembly 56 made of, e.g., aluminum and formed to have a cylindrical shape. A raw gas inlet 64 and a reduction gas inlet 72 are formed at the top of the head assembly 56 so as to communicate with the raw gas passage 52 and the reduction gas passage 54, respectively. A raw gas supply pipe 68 connected to a raw material tank 70 and a reduction gas supply pipe 76 connected to a reduction agent bomb 74 are connected to the raw gas inlet 64 and the reduction gas inlet 72, respectively. Spreading outlets 78 for spreading the raw gas and the reduction gas are formed on the bottom face of the head assembly 56.

Figure 2:
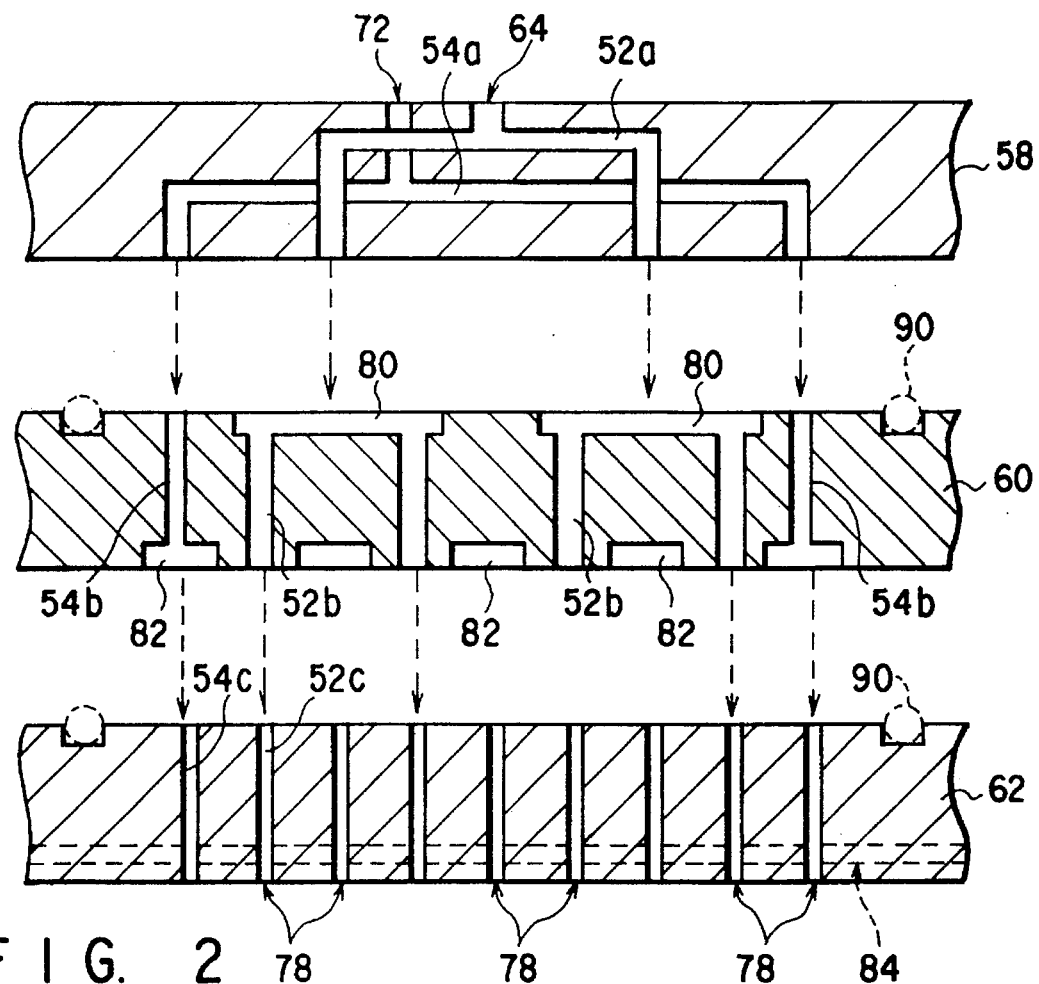
FIG. 2 is an enlarged cross sectional view showing a shower head assembly in a disassembled state.
Figure 3:
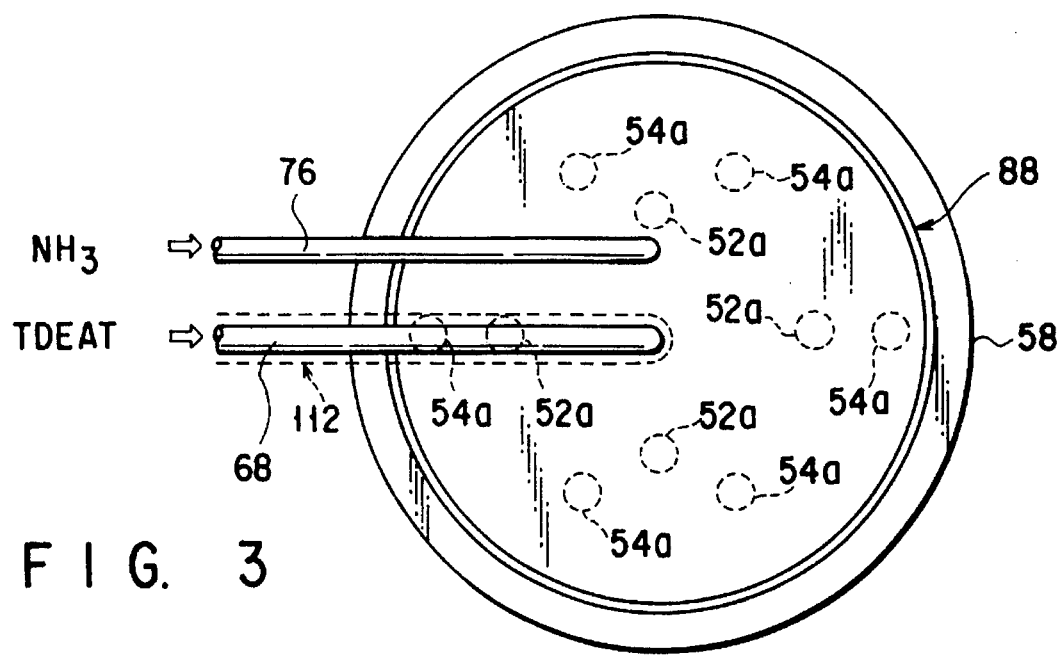
FIG. 3 is a plan view showing the upper part of the shower head assembly shown in FIG. 2.

To be specific, as shown in FIG. 2, the head assembly 56 is constituted by a plurality of, e.g., three cylindrical blocks, i.e., upper block 58, middle block 60 and lower block 62. The blocks 58, 60 and 62 are connected and assembled to be a unit of the head assembly 56 by a plurality of through bolts 63. It should be noted that the positions and shapes of passage portions 52a to 52c, 54a to 54c, and recesses 80 and 82 formed in the blocks 58, 60 and 62 are shown in FIG. 2 to allow the flow of the gas passages 52 and 54 from the block 58 to the block 62 in a vertical direction to be easily understood. As a result, those positions and shapes shown in FIG. 2 slightly differ from those shown in FIGS. 3 to 6, which will be described later.

The passage portions 52a and 54a, which are part of the raw gas passage 52 and the reduction gas passage 54, respectively, are formed in the upper block 58. The openings of the passage potions 52a and 54a, arranged on the top face of the upper block 58, function as the above described raw gas inlet 64 and reduction gas inlet 72, respectively. Each of the passage portions 52a and 54a is branched in radial directions inside the upper block 58, and has a plurality of openings arranged on the bottom face of the block 58. The arrangement of the openings of the passage portions 52a and 54a on the bottom face of the upper block 58 is shown by broken lines in FIG. 3.

As shown in FIG. 4, a plurality of recesses 80 used as manifold heads for the raw gas are formed in the top face of the middle block 60. The recesses 80, therefore, communicates with the passage portion 52a for the raw gas, formed in the upper block 58. A plurality of through holes are formed from the recesses 80 to the bottom face of the middle block 60, and are used as the passage portions 52b, which are part of the raw gas passage 52.

As shown in FIG. 5, a plurality of recesses 82 used as manifold heads for the reduction gas are formed in the bottom face of the middle block 60. A plurality of through holes are formed from the recesses 82 to the top face of the middle block 60, and are used as the passage portions 54b, which are part of the reduction gas passage 54. The upper openings of the passage portions 54b arranged on the top face of the middle block 60, therefore, communicate one by one with the openings of the passage portion 54a for the reduction gas, formed in the upper block 58.

As shown in FIG. 6, viewing the bottom face of the lower block 62, a plurality of through holes, which are substantially the same, are formed in the lower block 62 almost overall. These through holes consist of ones used as the passage portions 52c, which are part of the raw gas passage 52, and ones used as the passage portions 54c, which are part of the reduction gas passage 54. The upper openings of the passage portions 52c arranged on the top face of the lower block 62 communicate one by one with the openings of the passage portion 52b for the raw gas, formed in the middle block 60. The upper openings of the passage portions 54c arranged on the top face of the lower block 62 communicate with the recesses 82 for the reduction gas, formed in the middle block 60.

The passage portions 52c for the raw gas form rows while the passage portions 54c for the reduction gas form other rows, such that the rows of the passage portions 52c and the rows of the passage portions 54c are alternately arranged. In FIG. 6, the spreading outlets of the passage portions 52c for the raw gas are indicated by circles each provided with a cross mark, while the spreading outlets of the passage portions 54c for the reduction gas are indicated by blank circles.

The through holes consisting the passage portions 52c and 54c have a diameter of about 5 to 6 mm, and are arranged at a pitch of about 10 to 20 mm in a matrix format. The diameter and pitch of the through holes, however, can be varied in consideration of conditions, such as gas supply rates, a process pressure.

The passage portions 52a to 52c and 54a to 54c are easily formed by drilling the blocks 58 to 62. In a case where a horizontal hole is formed in a block, drilling is performed from a side of the block, and then an unnecessary opening is closed by a plug. It should be noted that a lot of the passage portions 52a to 52c and 54a to 54c, and recesses 80 and 82 are actually formed in the blocks 58, 60 and 62, though some of them are shown in FIGS. 1 to 6, as a matter of convenience to easily understand the structure.

In the case of forming a TiN film, a process pressure is about 400° C. As a result, the bottom surface of the lower block 62, i.e., the gas spreading section, which directly faces the wafer W, is exposed to heat radiation of a high temperature from the wafer W. In other words, the bottom face of the lower block 62 is heated up to a temperature, at which the TDEAT gas reacts with the reduction gas and deposits a product, i.e., up to about 100° C. or more. It follows that the product may be adhered to the gas spreading section immediately after the TDEAT gas is spread.

In order to solve this problem, a cooler 84 is arranged inside the lower block 62 so as to exist along the bottom face of the lower block 62. To be specific, the cooler 84 comprises a coolant passage which runs in a zigzag fashion among the passage portions 52c and 54c formed in the lower block 62. During a film forming process, the bottom face of the lower block 62 is kept at a temperature of about 40° to 100° C. by a coolant, such as water, flowing through the passage 84. The passage 84 penetrates the middle and upper blocks 60 and 58 and is connected to a coolant inlet 84a and a coolant outlet 84b. For example, water having a temperature of 40° C. or more is preferably used in consideration of the liquefying temperature of the TDEAT gas. This is a matter of course wherein another coolant my be used.

On the other hand, the heat given to the bottom face of the lower block 62 is not so easily transmitted to the middle and upper blocks 60 and 58, since there is a relatively large heat resistance at the contacting portions between the blocks. As a result, the middle and upper blocks 60 and 58 may be cooled down to about 40° C. or less, at which the TDEAT gas is liquefied, while the bottom face of the lower block 62 may be overheated. If the temperature of the middle and upper blocks 60 and 58 is lowered, as described above, the TDEAT gas is liquefied in the blocks 60 and 58 to plug up the gas passage portions.

In order to solve this problem, a ring heater 88 is arranged in the upper and middle blocks 58 and 60 so as to surround the passage portions 52a, 52b, 54a and 54b. At least the passage portions 52a and 52b for the raw gas are kept at a temperature of about 40° to 100° C. by the heater 88. For example, a silicone rubber heater may be used as the heater 88.

Seal members 90, such as O-rings, are arranged along the peripheries of the contacting portions between the blocks 58, 60 and 62, so as to prevent the gases from leaking outside. A seal member 92, such as an O-ring, is arranged in that portion of the ceiling of the process chamber 28, at which the shower head 50 is attached, so as to maintain airtightness of the process chamber.

One end of the raw gas supply pipe 68 for the TDEAT gas is inserted into TDEAT liquid 94 stored in the raw material tank 70. A pressurizing gas supply pipe 98 connected to a $N_2$ gas bomb 96 is inserted into a space above the liquid in the tank 70. The supply pipe 98 is provided with a flow control valve 99, by which the supplied gas pressure is controlled, while the TDEAT liquid 94 is forcedly fed in the raw gas supply pipe 68 by pressure.

The raw gas supply pipe 68 is provided with a switching valve 100, flow control valve 102 and vaporizer 104 in this order toward its downstream. A carrier gas pipe 108 connected to a bomb 106 containing a carrier gas consisting of an inactive gas, such as $N_2$, is connected to the vaporizer 104. The TDEAT liquid, which has been controlled over its flow rate by the flow control valve 102, is mixed with the carrier gas in the vaporizer 104, and fed to the process chamber in a mist state. The flow rate of the carrier gas is controlled by a flow control valve 110 arranged on the carrier gas line 108.

Since TDEAT is liquefied at a temperature of 40° C. or less, it is necessary to prevent the TDEAT gas or mist from being turned back into liquid during its supply. In order for this, heating means 112, such as a tape heater, is arranged all over the vaporizer 104 and the raw gas supply pipe 68 located between the vaporizer 104 and the shower head 50. The TDEAT gas is kept at a temperature of, e.g., about 40° to 100° C., at which the TDEAT gas is not turned back into liquid or thermally decomposed, in the raw gas supply pipe 68. Another heating means (not shown) is arranged on the side wall of the process chamber 28 so that the supplied raw gas is not turned back into liquid.

The reduction gas supply pipe 76 connected to the reduction agent bomb 74 for storing $NH_3$ is provided with a switching valve 114 and a flow control valve 116. The reduction gas is caused to flow in the reduction gas supply pipe 76 while its flow rate is controlled by the valves 114 and 116.

The CVD apparatus 26 having a above described constitution is operated as follows.

At first, the gate valve 46 is opened, and the wafer W is transferred by a transfer arm (not shown) onto the work table 30, on which the wafer W is mounted and held. Then, the process chamber 28 is continuously vacuum-exhausted, and is kept at a process pressure, such as about 300 mTorr. The wafer W is heated and kept at a process temperature, such as about 400° C., by the lamps 40.

On the other hand, the raw gas and the reduction gas are fed from the raw material tank 70 and the reduction agent bomb 74, respectively, to the shower head 50, and then are spread from the spreading outlets 78 into the process space S. The raw gas and the reduction gas are mixed in the process space S, and react with each other to provide a film forming material, so that a TiN film is formed on the surface of the wafer W.

During the film forming process, the TDEAT liquid stored in the raw material tank 70 is forcedly fed in a liquid state by pressure which is given by the pressurizing gas supplied from the $N_2$ gas bomb 96. The TDEAT liquid is sent to the vaporizer 104 while its flow rate is controlled by the flow control valve 102. Into the vaporizer 104, a carrier gas, such as $N_2$ gas, is supplied in a pressurized state, so that the TDEAT liquid is turned into vapor or mist by means of a theory similar to that of a carburetor.

The TDEAT, which has been turned into mist, is fed to the shower head 50 through the raw gas supply pipe 68. The downstream portion of the raw gas supply pipe 68 from the vaporizer 104 is always heated and kept by the heating means 112 at a temperature in a predetermined range, so that the TDEAT mist is not turned back into liquid, or overheated up to a temperature, at which the TDEAT mist is decomposed, during its supply. As a result, the TDEAT is introduced into the head assembly 56, while it is kept in a mist or vapor state. It should be noted that the pressure in the raw gas supply pipe 68 is higher than that in the head assembly 58, and thus the TDEAT is apt to be liquefied more in the supply pipe 68. For this reason, the raw gas supply pipe 68 is heated up to 95° C. or more.

The TDEAT in a vapor state is spread into the process space S from the spreading outlets 78, after it passes through the raw gas passage 52 in the head assembly 56. On the other hand, the $NH_3$ gas fed from the reduction gas bomb 74 is spread into the process space S from the spreading outlet 78, after it passes through the reduction gas passage 54 in the head assembly 56. The raw gas and the reduction gas are mixed with each other for the first time when they are spread into the process space S, and then react with each other so as to produce a film material for forming a TiN film.

During the film forming process, the bottom face of the lower block 62, i.e., gas spreading section, which faces the wafer W, is exposed to heat radiation emitted from the wafer W. The bottom face of the lower block 62 is cooled by the cooler 84, so as to prevent the gas reaction from being accelerated too much by the heat of the bottom face of the lower block 62, thereby preventing a product from being deposited on the bottom face of the lower block 62. To be specific, a coolant is caused to flow in the passage 84, so that the bottom face of the lower block 62 is cooled down to 100° C. or less, preferably a temperature between 40° and 50° C. It should be noted that a coolant, such as water, of 40° C. or more is preferably used, so that the raw gas is prevented from being turned back into liquid due to over-cooling.

In contrast, the middle and upper blocks 60 and 58 are heated by the heater 88, since they do not directly receive heat radiation emitted from the wafer W. With the heater 88, the passage portions 52b and 52a for the raw gas is kept at a temperature, e.g., between 40° and 100° C., at which the TDEAT gas is not turned back into liquid or thermally decomposed.

As described above, since the two kinds of process gases are supplied up to the process space S through the independent passages, respectively, no reaction product is deposited on an undesirable halfway point of their supply. Further, since the bottom face of the lower block 62, which receives heat radiation emitted from the wafer W, is cooled by the cooler 84, the gas reaction is not so accelerated near the gas spreading outlets 78. On the other hand, since the upper and middle blocks 58 and 60 are heated by the heater 88, the raw gas is prevented from being turned back into liquid in the passage portions 52a and 52b for the raw gas in the blocks 58 and 60. Still further, since the raw gas is supplied while the raw liquid is controlled over its flow rate and then vaporized, it is possible to accurately control the flow rate of the raw gas, as compared to the case of a bubbling supply which provides a less accurate flow control.

Let us describe a modification of the shower head with reference to FIGS. 7 to 14. The reference numerals used commonly in FIGS. 1 to 6 and FIGS. 7 and 14 denote the same members.

Figure 7:
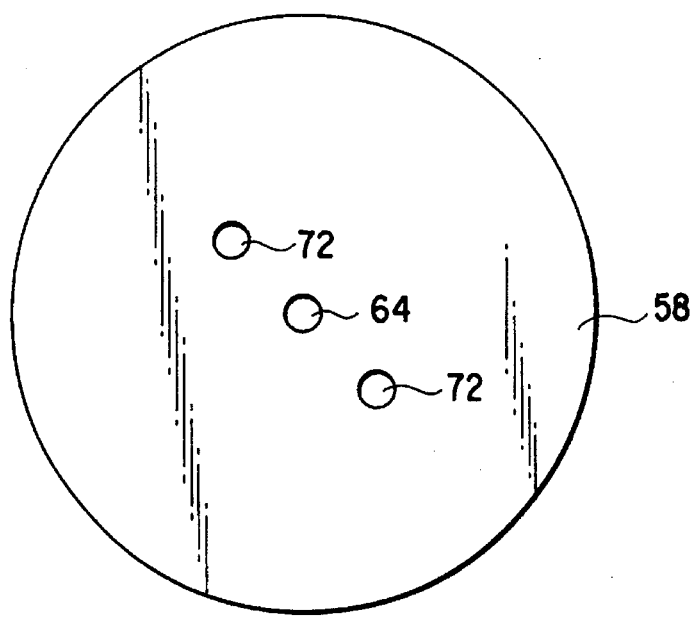
FIGS. 7, 8 and 9 are views showing the top face, a cross sectional diagram of passage portions, and the bottom face, respectively, of an upper block included in a modification of the shower head assembly.
Figure 8:
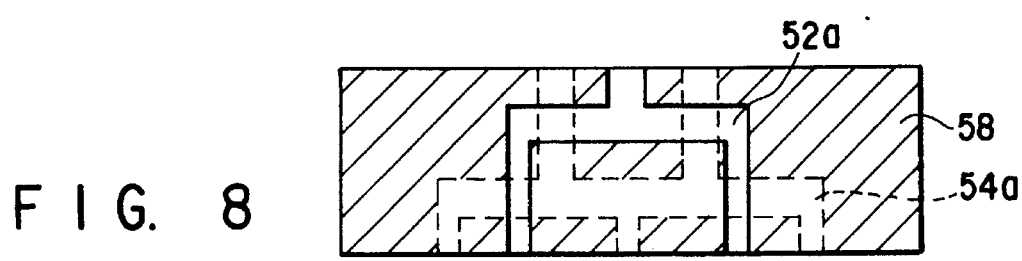
Figure 9:
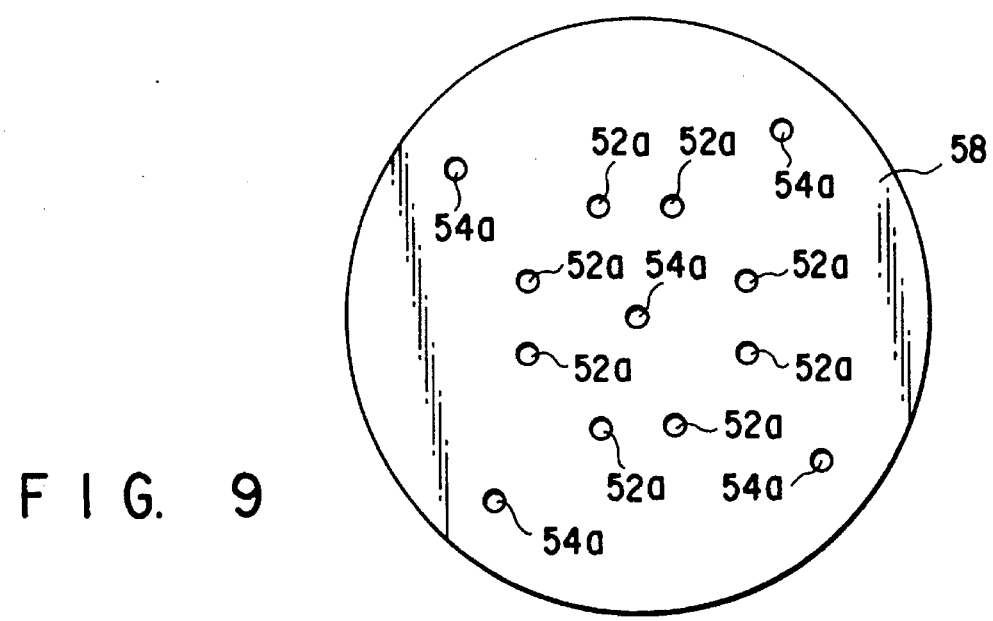
Figure 15:
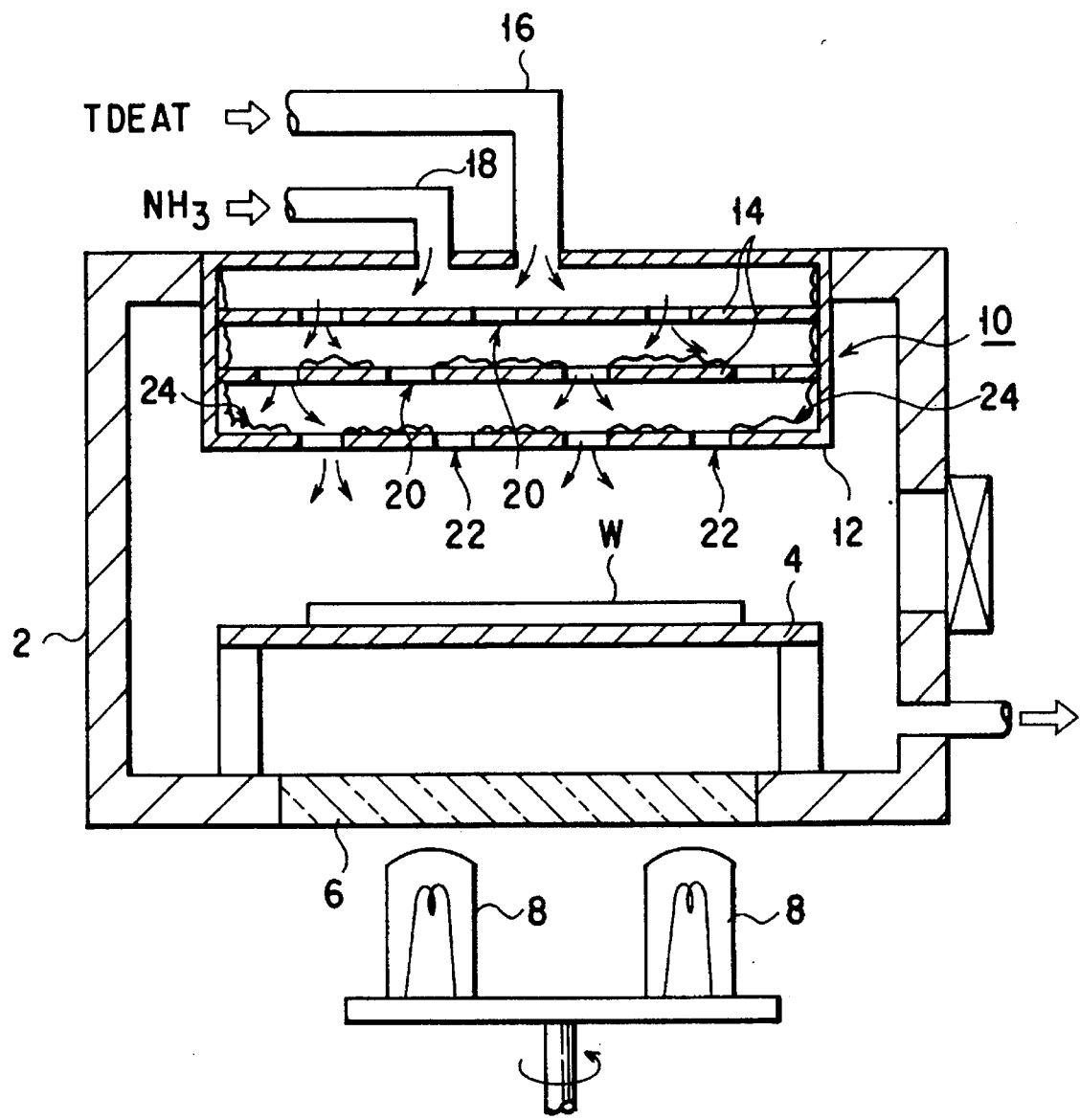
FIG. 15 is a cross sectional view schematically showing a film forming apparatus having a conventional shower head.

The shower head of this modification also includes a head assembly 56 consisting of tree cylindrical blocks, i.e., an upper block 58, a middle block 60 and a lower block 62. FIGS. 7, 8 and 9 show the top face, a cross sectional diagram of passage portions, and the bottom face, respectively, of the upper block 58. FIGS. 10, 11 and 12 show the top face, a cross sectional diagram of passage portions, and the bottom face, respectively, of the middle block 60. FIGS. 13 and 14 show the bottom face, and a plane diagram of a coolant passage 84, respectively, of the lower block 62.

As shown in FIGS. 7 to 9, a raw gas inlet 64 connected to the raw gas supply pipe 68, and two reduction gas inlets 72 connected to the reduction gas supply pipe 76 are arranged on the top face of the upper block 58. Passage portions 52a and 54a, which are part of the raw gas passage 52 and the reduction gas passage 54, respectively, are formed in the upper block 58. The passage portions 52a and 54a communicates with the raw gas inlet 64 and reduction gas inlet 72, respectively. Each of the passage portions 52a and 54a is branched in radial directions inside the upper block 58, and has a plurality openings arranged on the bottom face of the block 58. The arrangements of the passage portions 52a and 54a are shown by solid lines and broken lines, respectively, in FIG. 8, as a matter of convenience.

As shown in FIGS. 10 to 12, a plurality of recesses 80 used as manifold heads for the raw gas are formed in the top face of the middle block 60. The recesses 80, therefore, communicate with the passage portion 52a for the raw gas, formed in the upper block 58. A plurality of through holes are formed from the recesses 80 to the bottom face of the middle block 60, and are used as passage portions 52b, which are part of the raw gas passage 52.

Each of the passage portions 52b for the raw gas has an opening on a rectangular projection 81 formed on the bottom face of the middle block 60 and having a flat lower surface. An endless ring projection 83 is also formed along the outer edge of the bottom face of the middle block 60 and has a flat lower surface. The lower surfaces of the rectangular projections 81 and the ring projection 83 are flush with each other and are in contact with the upper face of the lower block 62 in one plane.

A space formed in the bottom face of the middle block 60 between the rectangular projections 81 and the ring projection 83 is a recess 82 used as manifold heads for the reduction gas. A plurality of through holes are formed from the recess 82 to the top face of the middle block 60, and are used as passage portions 54b, which are part of the reduction gas passage 54. The upper openings of the passage portions 54b arranged on the top face of the middle block 60, therefore, communicate one by one with the openings of the passage portion 54a for the reduction gas, formed in the upper block 58. The arrangements of the passage portions 52b and 54b are shown by solid lines and broken lines, respectively, in FIG. 11, as a matter of convenience.

As shown in FIG. 13, a plurality of through holes, which are substantially the same, are formed in the lower block 62 almost overall. These through holes consist of ones used as passage portions 52c, which are part of the raw gas passage 52, and ones used as passage portions 54c, which are part of the reduction gas passage 54. In FIG. 13, the spreading outlets of the passage portions 52c for the raw gas are indicated by circles, while the spreading outlets of the passage portions 54c for the reduction gas are indicated by crosses.

The upper openings of the passage portions 52c arranged on the top face of the lower block 62 communicate one by one with the openings of the passage portion 52b for the raw gas, formed in the middle block 60. The upper openings of the passage portions 54c arranged on the top face of the lower block 62 communicate with the recess 82 for the reduction gas, formed in the middle block 60.

As shown in FIG. 13, the passage portions 52c for the raw gas and the passage portions 54c for the reduction gas are alternately arranged in both of X and Y directions which are perpendicular to each other, so as to form a matrix format. However, the recess 82 for the reduction gas formed in the middle block 60 exists all around the rectangular projections 81 corresponding to the passage portions 52b for the raw gas, so that a degree of design freedom of the passage portions 54c for the reduction gas formed in the lower block 62 is high. For example, therefore, it is possible to alternately arrange rows of the passage portions 52c for the raw gas and rows of the passage portions 54c for the reduction gas, as shown in FIG. 6.

As shown in FIG. 14, a cooler or coolant passage 84 is arranged inside the lower block 62 so as to cool the bottom face of the lower block 62. In this modification, the coolant passage 84 is divided into two portions each running along the bottom face of the lower block 62 and in a zigzag fashion among the passage portions 52c and 54c formed in the lower block 62. Since the coolant passage 84 is divided into portions, the cooling function can be increased relative to the bottom face of the lower block 62.

It should be noted that although the above described shower head assemblies shown in the drawings have three blocks 58, 60 and 62, it is possible to modify the shower head assemblies so as to include 4 or more blocks by dividing the blocks 58, 60 and 62.

Further, although the CVD apparatus shown in the drawings exemplifies a case where a TiN film is formed, using TDEAT and $NH_3$ as a process gas, it is possible to apply the present invention to a case where a TiN film is formed, using tetradimethylaminotitanium, i.e., TDMAT, and also to a case where another metal film, such as a Ti film, Al film or W film, is formed. As an object to be subjected to a film forming process, another substrate, such as an LCD substrate, may be used in place of a semiconductor wafer.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A shower head having first and second passages for independently and respectively supplying first and second reaction gases, which are capable of reacting with each other, into a process chamber, said first reaction gas being liquefied at and below a first temperature, and said first and second reaction gases reacting with each other at and above a second temperature which is higher than said first temperature, said shower head comprising:

first, second and third blocks independently formed and having holes which define said first and second passages, said second block being interposed between said first and third blocks, such that said first and second passages respectively have first and second introduction inlets arranged on said first block for respectively introducing said first and second gases, and also respectively have a plurality of first supply outlets and a plurality of second supply outlets arranged on said third block for respectively supplying said first and second reaction gases into said process chamber, and each of said first and second passages is branched from said first block to said third block;

a cooler arranged in said third block near said first and second supply outlets, for cooling said first and second supply outlets;

a heater arranged in said first and second blocks, for heating said first passage in said first and second blocks up to a temperature above said first temperature; and a connector for connecting said first, second and third blocks.

2. The shower head according to claim 1, wherein said cooler comprises a coolant passage arranged along said first and second supply outlets.

3. The shower head according to claim 1, wherein said cooler cools said first and second supply outlets to a temperature between said first and second temperatures.

4. The shower head according to claim 1, wherein said first and second supply outlets are alternately arranged in a first direction.

5. The shower head according to claim 1, wherein said first block has first and second faces arranged on the opposite sides, and first and second holes respectively constituting part of said first and second passages, such that said first and second holes of said first block respectively have said first and second introduction inlets arranged on said first face of said first block, and also respectively have outlets arranged on said second face of said first block;

said second block has first and second faces arranged on the opposite sides, a plurality of first holes constituting part of said first passage, and a plurality of second holes constituting part of said second passage, such that said first holes of said second block respectively have inlets commonly connected to a first recess arranged between said first and second blocks, and also respectively have outlets arranged on said second face of said second block, said first recess communicating with said first hole of said first block and constituting a manifold head for said first reaction gas, and said second holes of said second block respectively have inlets arranged on said first face of said second block, and also respectively have outlets commonly connected to a second recess arranged between said second and third blocks, said second recess constituting a manifold head for said second reaction gas;

said third block has first and second faces arranged on the opposite sides, a plurality of first holes constituting part of said first passage, and a plurality of second holes constituting part of said second passage, such that said first holes of said second block respectively have inlets arranged on said first face of said third block and communicating with said first holes of said second block, and also respectively have said first supply outlets arranged on said second face of said third block, and said second holes of said third block respectively have inlets arranged on said first face of said third block and communicating with said second recess, and also respectively have said second supply outlets arranged on said second face of said third block; and said connector connecting said first, second and third blocks such that said second face of said first block and said first face of said second block face each other, and said second face of said second block and said first face of said third block face each other.

6. A shower head having first and second passages for independently and respectively supplying first and second reaction gases, which are capable of reacting with each other, into a process chamber, said shower head comprising:

a first block having first and second faces arranged on the opposite sides, and first and second holes respectively constituting part of said first and second passages, such that said first and second holes of said first block respectively have first and second introduction inlets arranged on said first face of said first block for respectively introducing said first and second gases, and also respectively have outlets arranged on said second face of said first block;

a second block formed independently of said first block and arranged on said second face of said first block, said second block having first and second faces arranged on the opposite sides, a plurality of first holes constituting part of said first passage, and a plurality of second holes constituting part of said second passage, such that said first holes of said second block respectively have inlets commonly connected to a first recess arranged on said first face of said second block, and also respectively have outlets arranged on said second face of said second block, said first recess communicating with said first hole of said first block and constituting a manifold head for said first reaction gas, and said second holes of said second block respectively have inlets arranged on said first face of said second block, and also respectively have outlets commonly connected to a second recess arranged on said second face of said second block, said second recess constituting a manifold head for said second reaction gas;

a third block formed independently of said first and second blocks and arranged on said second face of said second block, said third block having first and second faces arranged on the opposite sides, a plurality of first holes constituting part of said first passage, and a plurality of second holes constituting part of said second passage, such that said first holes of said second block respectively have inlets arranged on said first face of said third block and communicating with said first holes of said second block, and also respectively have first supply outlets arranged on said second face of said third block for supplying said first reaction gas into said process chamber, and said second holes of said third block respectively have inlets arranged on said first face of said third block and communicating with said second recess, and also respectively have second supply outlets arranged on said second face of said third block for supplying said second reaction gas into said process chamber; and a connector for connecting said first, second and third blocks such that said second face of said first block and said first face of said second block face each other, and said second face of said second block and said first face of said third block face each other.

7. The shower head according to claim 6, wherein said first and second supply outlets are alternately arranged in a first direction.

8. The shower head according to claim 6, wherein said first reaction gas is liquefied at and below a first temperature, and said first and second reaction gases react with each other at and above a second temperature which is higher than said first temperature, said shower head further comprising, a cooler arranged in said third block near said first and second supply outlets for cooling said first and second supply outlets, and a heater arranged in said first and second blocks for heating said first passage in said first and second blocks up to a temperature above said first temperature.

9. The shower head according to claim 8, wherein said cooler comprises a coolant passage arranged along said first and second supply outlets.

10. The shower head according to claim 8, wherein said cooler cools said first and second supply outlets to a temperature between said first and second temperatures.

11. A film forming apparatus for forming a film on an object to be processed, using first and second reaction gases, which are capable of reacting with each other, said first reaction gas being liquefied at and below a first temperature, and said first and second reaction gases reacting with each other at and above a second temperature which is higher than said first temperature, said apparatus comprising:

(a) a process chamber;

(b) a work table for supporting said object in said process chamber;

(c) a heater for heating said objected supported by said work table up to a third temperature higher than said second temperature;

(d) an exhaust for exhausting said process chamber; and (e) a shower head having first and second passages for independently and respectively supplying said first and second reaction gases into said process chamber, said shower head comprising, first, second and third blocks independently formed and having holes which define said first and second passages, said second block being interposed between said first and third blocks, such that said first and second passages respectively have first and second introduction inlets arranged on said first block for respectively introducing said first and second gases, and also respectively have a plurality of first supply outlets and a plurality of second supply outlets arranged on said third block for respectively supplying said first and second reaction gases into said process chamber, and each of said first and second passages is branched from said first block to said third block, a cooler arranged in said third block near said first and second supply outlets, for cooling said first and second supply outlets, a heater arranged in said first and second blocks, for heating said first passage in said first and second blocks up to a temperature above said first temperature, and a connector for connecting said first, second and third blocks.

12. The apparatus according to claim 11, wherein said cooler comprises a coolant passage arranged along said first and second supply outlets.

13. The apparatus according to claim 11, wherein said cooler cools said first and second supply outlets to a temperature between said first and second temperatures.

14. The apparatus according to claim 11, wherein said first and second supply outlets are alternately arranged in a first direction.

15. The apparatus according to claim 11, wherein said first block has first and second faces arranged on the opposite sides, and first and second holes respectively constituting part of said first and second passages, such that said first and second holes of said first block respectively have said first and second introduction inlets arranged on said first face of said first block, and also respectively have outlets arranged on said second face of said first block;

said second block has first and second faces arranged on the opposite sides, a plurality of first holes constituting part of said first passage, and a plurality of second holes constituting part of said second passage, such that said first holes of said second block respectively have inlets commonly connected to a first recess arranged between said first and second blocks, and also respectively have outlets arranged on said second face of said second block, said first recess communicating with said first hole of said first block and constituting a manifold head for said first reaction gas, and said second holes of said second block respectively have inlets arranged on said first face of said second block, and also respectively have outlets commonly connected to a second recess arranged between said second and third blocks, said second recess constituting a manifold head for said second reaction gas;

said third block has first and second faces arranged on the opposite sides, a plurality of first holes constituting part of said first passage, and a plurality of second holes constituting part of said second passage, such that said first holes of said second block respectively have inlets arranged on said first face of said third block and communicating with said first holes of said second block, and also respectively have said first supply outlets arranged on said second face of said third block, and said second holes of said third block respectively have inlets arranged on said first face of said third block and communicating with said second recess, and also respectively have said second supply outlets arranged on said second face of said third block; and said connector connecting said first, second and third blocks such that said second face of said first block and said first face of said second block face each other, and said second face of said second block and said first face of said third block face each other.

16. A film forming apparatus for forming a film on an object to be processed, using first and second reaction gases, which are capable of reacting with each other, said apparatus comprising:

(a) a process chamber;

(b) a work table for supporting said object in said process chamber;

(c) an exhaust for exhausting said process chamber; and (d) a shower head having first and second passages for independently and respectively supplying said first and second reaction gases into said process chamber, said shower head comprising, a first block having first and second faces arranged on the opposite sides, and first and second holes respectively constituting part of said first and second passages, such that said first and second holes of said first block respectively have first and second introduction inlets arranged on said first face of said first block for respectively introducing said first and second gases, and also respectively have outlets arranged on said second face of said first block, a second block formed independently of said first block and arranged on said second face of said first block, said second block having first and second faces arranged on the opposite sides, a plurality of first holes constituting part of said first passage, and a plurality of second holes constituting part of said second passage, such that said first holes of said second block respectively have inlets commonly connected to a first recess arranged on said first face of said second block, and also respectively have outlets arranged on said second face of said second block, said first recess communicating with said first hole of said first block and constituting a manifold head for said first reaction gas, and said second holes of said second block respectively have inlets arranged on said first face of said second block, and also respectively have outlets commonly connected to a second recess arranged on said second face of said second block, said second recess constituting a manifold head for said second reaction gas, a third block formed independently of said first and second blocks and arranged on said second face of said second block, said third block having first and second faces arranged on the opposite sides, a plurality of first holes constituting part of said first passage, and a plurality of second holes constituting part of said second passage, such that said first holes of said second block respectively have inlets arranged on said first face of said third block and communicating with said first holes of said second block, and also respectively have first supply outlets arranged on said second face of said third block for supplying said first reaction gas into said process chamber, and said second holes of said third block respectively have inlets arranged on said first face of said third block and communicating with said second recess, and also respectively have second supply outlets arranged on said second face of said third block for supplying said second reaction gas into said process chamber, and a connector for connecting said first, second and third blocks such that said second face of said first block and said first face of said second block face each other, and said second face of said second block and said first face of said third block face each other.

17. The apparatus according to claim 16, wherein said first and second supply outlets are alternately arranged in a first direction.

18. The apparatus according to claim 16, wherein said first reaction gas is liquefied at and below a first temperature, and said first and second reaction gases react with each other at and above a second temperature which is higher than said first temperature, said apparatus further comprising a heater for heating said objected supported by said work table up to a third temperature higher than said second temperature, said shower head further comprising, a cooler arranged in said third block near said first and second supply outlets for cooling said first and second supply outlets, and a heater arranged in said first and second blocks for heating said first passage in said first and second blocks up to a temperature at said first temperature or more.

19. The apparatus according to claim 18, wherein said cooler comprises a coolant passage arranged along said first and second supply outlets.

20. The apparatus according to claim 18, wherein said cooler cools said first and second supply outlets to a temperature between said first and second temperatures.

* * * * *